United States Patent
Kohno

(10) Patent No.: US 11,031,208 B2
(45) Date of Patent: Jun. 8, 2021

(54) COLD CATHODE FIELD-EMISSION ELECTRON GUN, ADJUSTMENT METHOD FOR COLD CATHODE FIELD-EMISSION ELECTRON GUN, SHARPENING METHOD FOR EMITTER, AND ELECTRON MICROSCOPE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/131,631

(22) Filed: Sep. 14, 2018

(65) Prior Publication Data
US 2019/0096626 A1    Mar. 28, 2019

(30) Foreign Application Priority Data
Sep. 15, 2017  (JP) .............................. JP2017-178015

(51) Int. Cl.
*H01J 37/073*    (2006.01)
*H01J 37/28*     (2006.01)
*H01J 37/147*    (2006.01)

(52) U.S. Cl.
CPC .......... *H01J 37/073* (2013.01); *H01J 37/147* (2013.01); *H01J 37/28* (2013.01); *H01J 2237/022* (2013.01); *H01J 2237/06341* (2013.01); *H01J 2237/06375* (2013.01); *H01J 2237/2802* (2013.01)

(58) Field of Classification Search
CPC ........ H01J 37/073; H01J 37/147; H01J 37/28; H01J 2237/022; H01J 2237/2802; H01J 2237/06341; H01J 2237/06375
See application file for complete search history.

(56) References Cited

U.S. PATENT DOCUMENTS

| 3,766,427 A * | 10/1973 | Coates ................... H01J 3/021 |
| | | 315/382 |
| 4,427,886 A * | 1/1984 | Martin ................. H01J 37/073 |
| | | 250/310 |
| 6,583,413 B1* | 6/2003 | Shinada .................. H01J 37/28 |
| | | 250/306 |
| 8,188,451 B1* | 5/2012 | Nasser-Ghodsi ..... H01J 37/265 |
| | | 250/493.1 |
| 8,736,170 B1* | 5/2014 | Liu ....................... H01J 37/073 |
| | | 315/111.31 |
| 8,835,884 B2* | 9/2014 | Arai ........................ H01J 49/26 |
| | | 250/492.3 |
| 2006/0066202 A1* | 3/2006 | Manohara ............... H01J 9/025 |
| | | 313/311 |

(Continued)

FOREIGN PATENT DOCUMENTS

JP    200773521 A    3/2007
JP    2009205904 A   9/2009

(Continued)

OTHER PUBLICATIONS

Office Action issued in JP2017-178015 dated Feb. 16, 2021.

*Primary Examiner* — Brooke Purinton
(74) *Attorney, Agent, or Firm* — The Webb Law Firm

(57) ABSTRACT

A cold cathode field-emission electron gun includes: an emitter; an extraction electrode which extracts electrons from the emitter; and a biased electrode which is disposed closer to the emitter than the extraction electrode. A voltage applied to the biased electrode is variable.

11 Claims, 8 Drawing Sheets

(56) References Cited

U.S. PATENT DOCUMENTS

| | | | |
|---|---|---|---|
| 2007/0096838 A1* | 5/2007 | Kudoh | H01J 37/073 331/84 |
| 2007/0158588 A1 | 7/2007 | Zhou et al. | |
| 2008/0315089 A1* | 12/2008 | Yasuda | H01J 37/073 250/306 |
| 2009/0179161 A1* | 7/2009 | Ward | H01J 37/08 250/492.21 |
| 2009/0218508 A1* | 9/2009 | Tamura | H01J 37/063 250/396 R |
| 2010/0237763 A1* | 9/2010 | Shiraga | H01J 3/021 313/336 |
| 2010/0320942 A1* | 12/2010 | Hayn | H01J 37/063 315/379 |
| 2011/0221360 A1* | 9/2011 | Adamec | H01J 37/073 315/307 |
| 2012/0091359 A1* | 4/2012 | Lanio | H01J 37/06 250/396 R |
| 2014/0264019 A1* | 9/2014 | Adamec | H01J 37/073 250/310 |
| 2015/0047079 A1* | 2/2015 | Kozakai | H01J 37/073 850/26 |
| 2015/0255240 A1* | 9/2015 | Ichimura | H01J 37/073 205/646 |
| 2016/0104597 A1* | 4/2016 | Imai | H01J 37/073 250/310 |
| 2018/0190469 A1* | 7/2018 | Cheng | H01J 37/153 |
| 2019/0237289 A1* | 8/2019 | Kasuya | H01J 37/073 |

FOREIGN PATENT DOCUMENTS

| | | |
|---|---|---|
| JP | 2010182466 A | 8/2010 |
| JP | 2014183046 A | 9/2014 |

* cited by examiner

COLD CATHODE FIELD-EMISSION ELECTRON GUN, ADJUSTMENT METHOD FOR COLD CATHODE FIELD-EMISSION ELECTRON GUN, SHARPENING METHOD FOR EMITTER, AND ELECTRON MICROSCOPE

CROSS-REFERENCE TO RELATED APPLICATION

This application claims priority to Japanese Patent Application No. 2017-178015 filed Sep. 15, 2017, the disclosure of which is hereby incorporated in its entirety by reference.

Japanese Patent Application No. 2017-178015, filed on Sep. 15, 2017, is hereby incorporated by reference in its entirety.

BACKGROUND OF THE INVENTION

Field of the Invention

The present invention relates to a cold cathode field-emission electron gun, an adjustment method for a cold cathode field-emission electron gun, a sharpening method for an emitter, and an electron microscope.

Description of Related Art

A cold cathode field-emission electron gun is an electron gun which applies a strong electric field to an emitter at room temperature to cause the emitter to emit electrons due to a tunnel effect. Since an energy spread of electrons emitted from a cold cathode field-emission electron gun is narrower than that of a thermal field-emission electron gun or a Schottky-type electron gun, high energy resolution is obtained in electron energy-loss spectroscopy (EELS). In addition, with a cold cathode field-emission electron gun, a smaller electron probe can be formed than with a Schottky-type electron gun.

A cold cathode field-emission electron gun is mounted to an electron microscope with high brightness and high resolution (for example, refer to JP-A-2010-182466).

FIG. 8 is a diagram illustrating an example of a configuration of a conventional cold cathode field-emission electron gun (an electron gun 101).

The electron gun 101 is configured to include an emitter 102, an extraction electrode 104 which forms a strong electric field on a surface (a tip) of the emitter 102, and an extraction power supply 106. In the electron gun 101, by applying an extracting voltage between the extraction electrode 104 and the emitter 102 with the extraction power supply 106, a strong electric field is generated on the surface of the emitter 102. Accordingly, electrons can be extracted from the emitter 102. The electrons extracted from the emitter 102 are accelerated to the extraction electrode 104 and subsequently accelerated by an accelerating electrode (not shown) or the like.

In the electron gun 101, by sharpening the tip of the emitter 102, an electric field is concentrated on the tip of the emitter 102 to realize a strong surface electric field. Therefore, the electric field weakens as a distance from the tip of the emitter 102 increases. As a result, the electrons extracted from the emitter 102 are relatively gradually accelerated between the emitter 102 and the extraction electrode 104. When a state continues in which a velocity of the electrons is low but current density is high, the electrons emitted from the emitter 102 are affected by interelectronic interaction, which results in a decline in brightness and an increase in energy spread.

SUMMARY OF THE INVENTION

The invention can provide a cold cathode field-emission electron gun capable of reducing an effect of interelectronic interaction, an adjustment method for a cold cathode field-emission electron gun capable of reducing an effect of interelectronic interaction, a sharpening method for an emitter in a cold cathode field-emission electron gun capable of reducing an effect of interelectronic interaction, and an electron microscope including the cold cathode field-emission electron gun described above.

According to a first aspect of the invention, there is provided a cold cathode field-emission electron gun including:

an emitter;

an extraction electrode which extracts electrons from the emitter; and a biased electrode which is disposed closer to the emitter than the extraction electrode, a voltage applied to the biased electrode being variable.

According to a second aspect of the invention, there is provided an adjustment method for a cold cathode field-emission electron gun which includes an emitter, an extraction electrode which extracts electrons from the emitter, and a biased electrode which is disposed closer to the emitter than the extraction electrode, the adjustment method including:

causing electrons to be emitted from the emitter by causing the biased electrode and the extraction electrode to form an electric field for causing electrons to be emitted from a tip of the emitter and an electric field for accelerating the electrons emitted from the emitter between the emitter and the extraction electrode, a voltage applied to the biased electrode being variable. According to a third aspect of the invention, there is provided a sharpening method for an emitter in a cold cathode field-emission electron gun which includes an emitter, an extraction electrode which extracts electrons from the emitter, and a biased electrode which is disposed closer to the emitter than the extraction electrode, the sharpening method including:

heating a tip of the emitter in a state where an electric field is formed on the tip of the emitter by the extraction electrode and the biased electrode, a voltage applied to the biased electrode being variable.

According to a fourth aspect of the invention, there is provided an electron microscope including the cold cathode field-emission electron gun described above.

DESCRIPTION OF THE INVENTION

Figure 1:
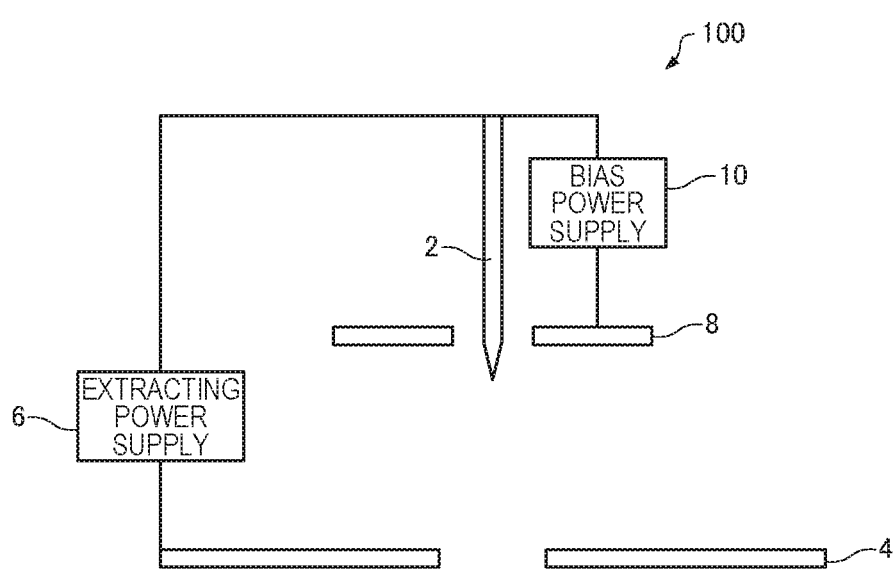
FIG. 1 is a diagram illustrating a configuration of an electron gun according to one embodiment of the invention.

According to one embodiment of the invention, there is provided a cold cathode field-emission electron gun including:

an emitter;

an extraction electrode which extracts electrons from the emitter; and a biased electrode which is disposed closer to the emitter than the extraction electrode, a voltage applied to the biased electrode being variable.

With such a cold cathode field-emission electron gun, since an electric field on a surface (a tip) of an emitter can be weakened with a biased electrode, extracting voltage can be increased while maintaining the electric field on the surface of the emitter at a desired strength. In other words, by applying a bias voltage to the biased electrode, the extracting voltage can be raised higher as compared to a case where the biased electrode is not provided. As a result, an electric field which is formed between the emitter and the extraction electrode can be strengthened and electrons can be further accelerated between the emitter and the extraction electrode. Therefore, with such an electron gun, since an effect of interelectronic interaction can be reduced, a decline in brightness and an increase in energy spread can be reduced.

Furthermore, with such an electron gun, since voltage applied to the biased electrode is variable, the electric field formed on the surface (the tip) of the emitter and the electric field formed between the emitter and the extraction electrode can be widely controlled.

According to one embodiment of the invention, there is provided an adjustment method for a cold cathode field-emission electron gun which includes an emitter, an extraction electrode which extracts electrons from the emitter, and a biased electrode which is disposed closer to the emitter than the extraction electrode, the adjustment method including:

causing electrons to be emitted from the emitter by causing the biased electrode and the extraction electrode to form an electric field for causing electrons to be emitted from a tip of the emitter and an electric field for accelerating the electrons emitted from the emitter between the emitter and the extraction electrode, a voltage applied to the biased electrode being variable.

With such an adjustment method for a cold cathode field-emission electron gun, the electron gun can be adjusted so that a desired extracting voltage and a desired emission current are obtained. Therefore, the electron gun can be adjusted so as to reduce an effect of interelectronic interaction. In addition, an electric field formed on a surface of the emitter and an electric field formed between the emitter and the extraction electrode can be widely controlled.

According to one embodiment of the invention, there is provided a sharpening method for an emitter in a cold cathode field-emission electron gun which includes an emitter, an extraction electrode which extracts electrons from the emitter, and a biased electrode which is disposed closer to the emitter than the extraction electrode, the sharpening method including:

heating a tip of the emitter in a state where an electric field is formed on the tip of the emitter by the extraction electrode and the biased electrode, a voltage applied to the biased electrode being variable.

With such a sharpening method for an emitter, since voltage applied to a biased electrode is variable, a tip of the emitter can be heated in a state where an electric field is formed on the tip of the emitter by an extraction electrode and the biased electrode. Therefore, the tip of the emitter (tip) can be sharpened by heating the emitter (tip) while applying a strong electric field thereto (in other words, by a buildup).

According to one embodiment of the invention, there is provided an electron microscope including the cold cathode field-emission electron gun described above.

Since such an electron microscope includes the electron gun according to the invention, a decline in brightness of an electron beam and an increase in an energy spread of the electron beam can be reduced.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Electron Gun

First, an electron gun according to one embodiment of the invention will be described with reference to the drawings. FIG. 1 is a diagram illustrating a configuration of an electron gun 100 according to one embodiment of the invention.

The electron gun 100 is a cold cathode field-emission electron gun. A cold cathode field-emission electron gun is an electron gun which applies a strong electric field to an emitter 2 at room temperature to cause the emitter 2 to emit electrons due to a tunnel effect.

As illustrated in FIG. 1, the electron gun 100 includes the emitter 2, an extraction electrode 4, an extraction power supply 6, a biased electrode 8, and a bias power supply 10.

The emitter 2 is an emission source of electrons or, in other words, a cathode. The emitter 2 is, for example, a tungsten tip.

The extraction electrode 4 is an electrode for extracting electrons from the emitter 2. When an extracting voltage is applied between the emitter 2 and the extraction electrode 4 by the extraction power supply 6, a strong electric field is generated on a surface (a tip) of the emitter 2. The strong electric field extracts electrons from the emitter 2. The extracting voltage is a voltage which creates an electric field to be formed on the surface of the emitter 2 for extracting electrons from the surface of the emitter 2.

The extraction power supply 6 is a power supply for applying the extracting voltage. A positive voltage is applied to the extraction electrode 4 by the extraction power supply 6. In addition, when sharpening the emitter 2, a negative voltage is applied to the extraction electrode 4 by the extraction power supply 6. The sharpening of the emitter 2 will be described later.

The biased electrode 8 is disposed closer to the emitter 2 than the extraction electrode 4. The biased electrode 8 is disposed in a vicinity of the emitter 2. A bias voltage is applied to the biased electrode 8 by the bias power supply 10. For example, an electric field on the surface of the emitter 2 can be weakened by applying the biased electrode (a negative voltage) to the biased electrode 8.

The bias voltage applied to the biased electrode 8 is variable. Varying a potential of the biased electrode 8 to positive or negative has the same effect as bringing a position of the biased electrode 8 close to the extraction electrode 4 or distancing the position of the biased electrode 8 from the extraction electrode 4. Controlling the potential of the biased electrode 8 enables an electric field formed on the surface of the emitter 2 and an electric field formed between the emitter 2 and the extraction electrode 4 to be widely controlled.

The bias power supply 10 is a power supply for applying the bias voltage. The bias voltage is applied to the biased electrode 8 by the bias power supply 10.

The electron gun 100 may be further provided with an accelerating electrode (not shown) for accelerating electrons extracted by the extraction electrode 4. The accelerating electrode is disposed to the rear of the extraction electrode 4. In other words, in the electron gun 100, the biased electrode 8, the extraction electrode 4, and the accelerating electrode are disposed in this order from a side of the emitter 2.

Figure 2:
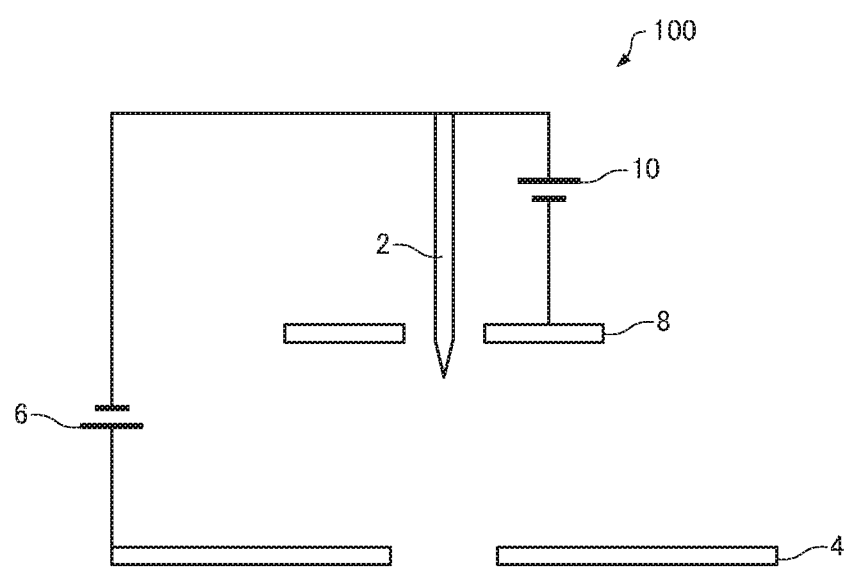
FIG. 2 is a diagram for explaining operations of an electron gun.

Next, operations of the electron gun 100 will be described. FIG. 2 is a diagram for explaining operations of the electron gun 100.

In the electron gun 100, as illustrated in FIG. 2, when causing the emitter 2 to emit electrons, a negative voltage (the biased voltage) is applied to the biased electrode 8 and a positive voltage (the extracting voltage) is applied to the extraction electrode 4. In other words, a voltage that weakens an electric field on the surface (tip) of the emitter 2 is applied to the biased electrode 8 while a voltage for extracting electrons from the emitter 2 is applied to the extraction electrode 4. Accordingly, the biased electrode 8 and the extraction electrode 4 form an electric field for causing electrons to be emitted from the surface of the emitter 2 and an electric field for accelerating the electrons emitted from the emitter 2 between the emitter 2 and the extraction electrode 4.

Figure 8:
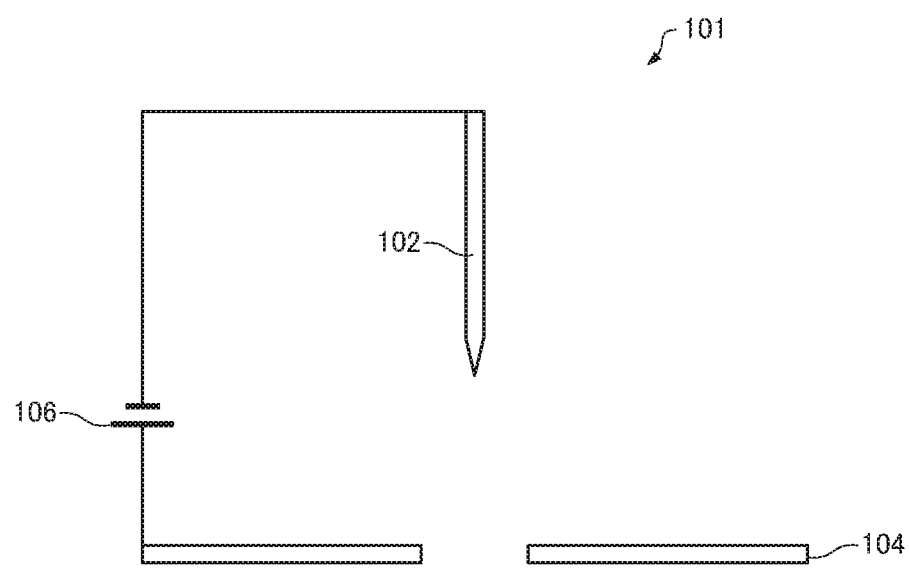
FIG. 8 is a diagram illustrating an example of a configuration of a conventional cold cathode field-emission electron gun.

By applying the bias voltage to the biased electrode 8, the extracting voltage can be raised higher as compared to a case where the biased electrode 8 is not provided (refer to FIG. 8) if strengths of the electric fields formed on the surface of the emitter 2 in both cases are the same. Therefore, with the electron gun 100, the electric field which is formed between the emitter 2 and the extraction electrode 4 can be strengthened. As a result, electrons can be further accelerated between the emitter 2 and the extraction electrode 4.

In the electron gun 100, a diameter of the emitter 2 changes with use. In addition, for example, in the electron gun 100, the diameter of the emitter 2 also changes due to flashing. Flashing refers to a process of instantaneously heating the emitter 2 to a high temperature to remove adsorption gas and fine protrusions due to ion sputtering which are present on the surface of the emitter 2. Performing flashing causes the diameter of the emitter 2 to increase.

When the diameter of the emitter 2 changes, an electric field formed on the surface of the emitter 2 changes. Specifically, when the diameter of the emitter 2 increases, the electric field on the surface of the emitter 2 weakens, and when the diameter of the emitter 2 decreases, the electric field on the surface of the emitter 2 strengthens.

In the electron gun 100, the bias voltage applied to the biased electrode 8 is variable. Therefore, by varying the bias voltage in accordance with a change in the diameter of the emitter 2, a desired extracting voltage and a desired emission current can be obtained even if the diameter of the emitter 2 changes. An emission current refers to an amount of electrons (a current) emitted from an electron gun.

For example, the electron gun 100 has the following features.

The electron gun 100 includes the emitter 2, the extraction electrode 4 which extracts electrons from the emitter 2, and the biased electrode 8 which is disposed closer to the emitter 2 than the extraction electrode 4. Therefore, the electric field on the surface of the emitter 2 can be weakened with the biased electrode 8 and extracting voltage can be increased while maintaining the electric field on the surface of the emitter 2 at a desired strength. In other words, by applying a bias voltage to the biased electrode 8, the extracting voltage can be raised higher as compared to a case where the biased electrode 8 is not provided. As a result, the electric field formed between the emitter 2 and the extraction electrode 4 can be strengthened and electrons can be further accelerated between the emitter 2 and the extraction electrode 4. Therefore, with the electron gun 100, since an effect of interelectronic interaction can reduced, a decline in brightness and an increase in energy spread can be reduced.

In addition, in the electron gun 100, the bias voltage applied to the biased electrode 8 is variable. Therefore, in the electron gun 100, the electric field formed on the surface of the emitter 2 and the electric field formed between the emitter 2 and the extraction electrode 4 (a distribution of acceleration fields) can be widely controlled.

Figure 3:
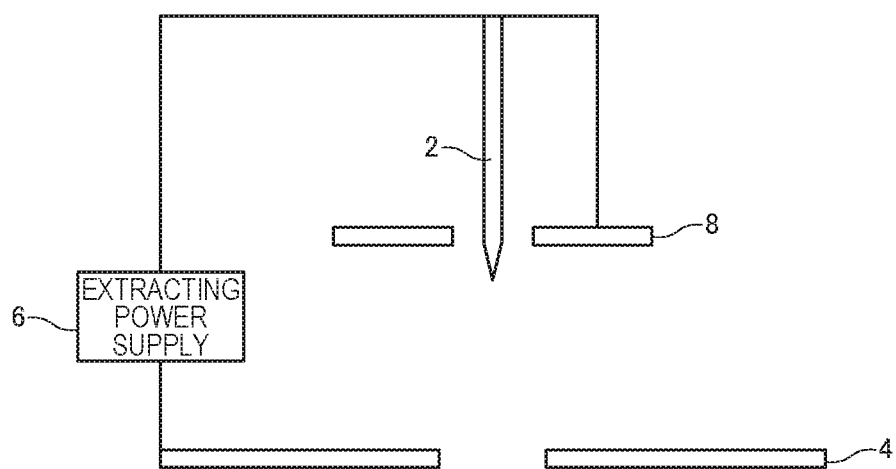
FIG. 3 is a diagram illustrating, as a reference example, a biased electrode being fixed to the same potential as an emitter.

FIG. 3 is a diagram illustrating, as a reference example, the biased electrode 8 being fixed to the same potential as the emitter 2.

Even when the biased electrode 8 is fixed to the same potential as the emitter 2, the electric field on the surface of the emitter 2 can be weakened with the biased electrode 8 and extracting voltage can be increased while maintaining the electric field on the surface of the emitter 2 at a desired strength. Accordingly, the electric field formed between the emitter 2 and the extraction electrode 4 can be strengthened and electrons can be accelerated. As a result, the effect of interelectronic interaction can be reduced.

The effect of the biased electrode 8 on the electric field formed on the surface of the emitter 2 is dependent on a distance between the emitter 2 and the biased electrode 8 (a position of the biased electrode 8). Therefore, when the biased electrode 8 is fixed to the same potential as the emitter 2, the position of the biased electrode 8 must be adjusted so that an appropriate electric field is formed on the surface of the emitter 2. In addition, even if the position of the biased electrode 8 can be adjusted, the diameter of the emitter 2 changes with the use of the electron gun 100. When the diameter of the emitter 2 changes with the use of the electron gun 100, an appropriate electric field cannot be formed on the tip of the emitter 2 by the biased electrode 8. As a result, for example, a period during which the electron gun can be used is shortened.

In contrast, since the bias voltage is variable in the electron gun 100, the bias voltage can be varied in accordance with the diameter of the emitter 2. Therefore, the period during which the electron gun is usable can be extended. In addition, since a change in the bias voltage corresponds to a change in the position of the biased electrode 8, the position of the biased electrode 8 need not be strictly adjusted.

In the electron gun 100, when causing the emitter 2 to emit electrons, a negative voltage is applied to the biased electrode 8 and a positive voltage is applied to the extraction electrode 4. Accordingly, the electric field on the surface of the emitter 2 can be weakened with the biased electrode 8 and extracting voltage can be increased while maintaining the electric field on the surface of the emitter 2 at a desired strength. As a result, an effect of interelectronic interaction can reduced and a decline in brightness and an increase in energy spread can be reduced.

In the electron gun 100, the emitter 2 is a tungsten tip. Therefore, in the electron gun 100, sharpening of the emitter 2 can be performed using buildup as will be described later.

2. Adjustment Method for Electron Gun

Next, an adjustment method for the electron gun 100 will be described. In the electron gun 100, the voltage (the bias voltage) applied to the biased electrode 8 and the voltage (the extracting voltage) applied to the extraction electrode 4 are adjusted prior to operating the electron gun 100 so that a desired extracting voltage and a desired emission current are obtained.

In the adjustment method for the electron gun 100, after an electric field for causing electrons to be emitted from the surface of the emitter 2 and an electric field for accelerating the electrons emitted from the emitter 2 between the emitter 2 and the extraction electrode 4 are formed by the biased electrode 8 and the extraction electrode 4, the emitter 2 is caused to emit electrons. Hereinafter, details of the adjustment method for the electron gun 100 will be described.

Figure 4:
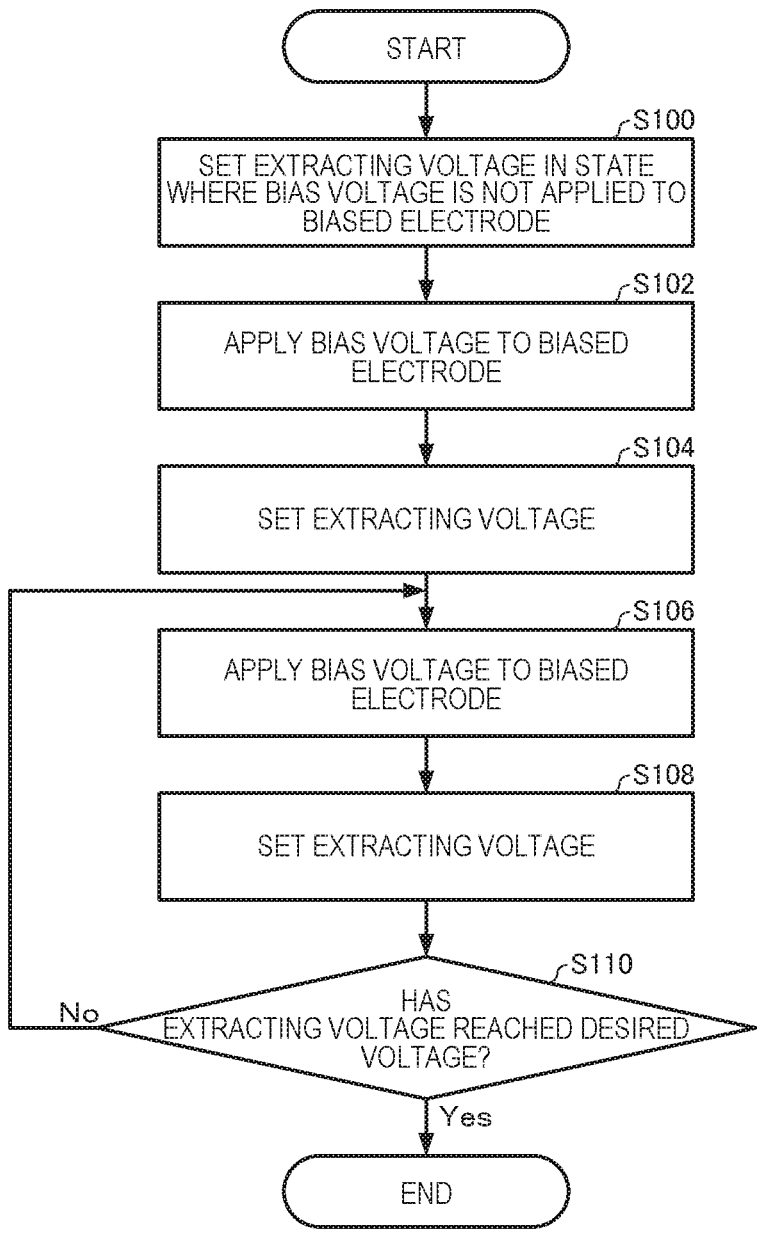
FIG. 4 is a flowchart illustrating an example of an adjustment method for an electron gun according to one embodiment of the invention.

FIG. 4 is a flowchart illustrating an example of the adjustment method for the electron gun 100 according to one embodiment of the invention.

First, in a state where a bias voltage is not applied to the biased electrode 8, a voltage (a first voltage or an extracting voltage) to be applied to the extraction electrode 4 is set so that a desired emission current is obtained (S100). Accordingly, the desired emission current is obtained.

Next, in a state where the voltage (the first voltage) set to the extraction electrode 4 so that a desired emission current is obtained is applied, a bias voltage (a first bias voltage) is applied to the biased electrode 8 (S102). Accordingly, the electric field formed on the surface of the emitter 2 weakens and the emission current decreases.

Next, in a state where the bias voltage (the first bias voltage) is applied to the biased electrode 8, a voltage (a second voltage or an extracting voltage) to be applied to the extraction electrode 4 is set so that a desired emission current is obtained (S104).

Accordingly, the desired emission current is obtained in a state where the bias voltage (the first bias voltage) is applied to the biased electrode 8. At this point, the second voltage is higher than the first voltage. As described above, in this step, the extracting voltage can be increased as compared to before applying the bias voltage (the first bias voltage) to the biased electrode 8 while maintaining the electric field formed on the surface of the emitter 2 at a desired strength.

Next, in a state where the voltage (the second voltage) set to the extraction electrode 4 so that a desired emission current is obtained is applied, a bias voltage (a second bias voltage) is applied to the biased electrode 8 (S106). Accordingly, the emission current decreases. At this point, the second bias voltage (an absolute value) is larger than the first bias voltage (an absolute value).

Next, in a state where the bias voltage (the second bias voltage) is applied to the biased electrode 8, a voltage (a third voltage or an extracting voltage) to be applied to the extraction electrode 4 is set so that a desired emission current is obtained (S108).

Accordingly, the desired emission current is obtained in a state where the bias voltage (the second bias voltage) is applied to the biased electrode 8. At this point, the third voltage is higher than the second voltage. As described above, in this step, the extracting voltage can be further increased while maintaining the electric field formed on the surface of the emitter 2 at a desired strength.

The step (S106) of applying a bias voltage to the biased electrode 8 in a state where the voltage set to the extraction electrode 4 so that a desired emission current is obtained is applied and the step (S108) of setting a voltage (an extracting voltage) to be applied to the extraction electrode 4 in a state where the bias voltage is applied to the biased electrode 8 are repetitively performed until the extracting voltage reaches a desired value. Subsequently, once the extracting voltage reaches the desired voltage (Yes in S110), the adjustment of the electron gun 100 is finished.

Due to the steps described above, the electron gun 100 can be adjusted.

By performing the adjustment described above, the desired extracting voltage and the desired emission current are obtained.

For example, the adjustment method for the electron gun 100 has the following features.

The adjustment method for the electron gun 100 includes the step of causing, after an electric field for causing electrons to be emitted from the tip (the surface) of the emitter 2 and an electric field for accelerating the electrons emitted from the emitter 2 between the emitter 2 and the extraction electrode 4 are formed by the biased electrode 8 and the extraction electrode 4, the emitter 2 to emit electrons. Therefore, with the adjustment method for the electron gun 100, the electron gun 100 can be adjusted so that a desired extracting voltage and a desired emission current are obtained. Therefore, the electron gun can be adjusted so as to reduce an effect of interelectronic interaction. In addition, the electric field formed on the surface of the emitter 2 and the electric field formed between the emitter 2 and the extraction electrode 4 can be widely controlled.

The adjustment method for the electron gun 100 includes: a step of setting a voltage (the first voltage) to be applied to the extraction electrode 4 so that a desired emission current is obtained; a step of applying a bias voltage (the first bias voltage) to the biased electrode 8 to reduce the emission current; and a step of setting a voltage (the second voltage) to be applied to the extraction electrode 4 so that a desired emission current is obtained in a state where the biased voltage (the first biased voltage) is applied to the biased electrode 8 and the emission current is reduced.

Furthermore, the adjustment method for the electron gun 100 includes: a step of applying a bias voltage (the second bias voltage) to the biased electrode 8 to reduce the emission current; and a step of setting a voltage (the third voltage) to be applied to the extraction electrode 4 so that a desired emission current is obtained in a state where the biased voltage (the second biased voltage) is applied to the biased electrode 8 and the emission current is reduced.

Therefore, according to the adjustment method for the electron gun 100, the electron gun 100 can be adjusted so that a desired extracting voltage and a desired emission current are obtained.

3. Sharpening Method for Emitter

Next, a sharpening method for the emitter 2 will be described. In one embodiment of the invention, a case where a tungsten tip is assumed to be used as the emitter 2 and buildup is used as the sharpening method for the emitter 2 will be described. Buildup is a method of sharpening the tip of the tip by heating the tip while applying a strong electric field thereto.

Figure 5:
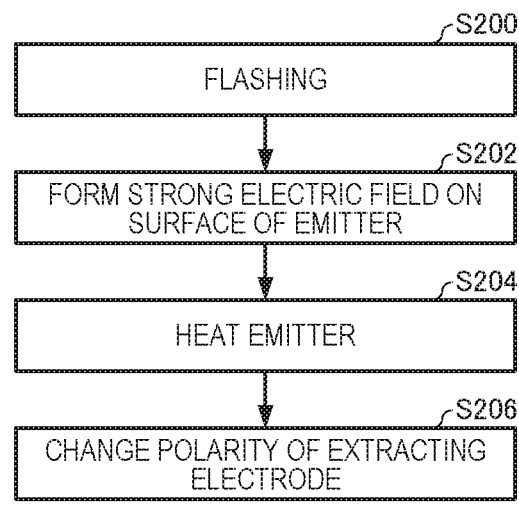
FIG. 5 is a flowchart illustrating an example of a sharpening method for an emitter according to one embodiment of the invention.
Figure 6:
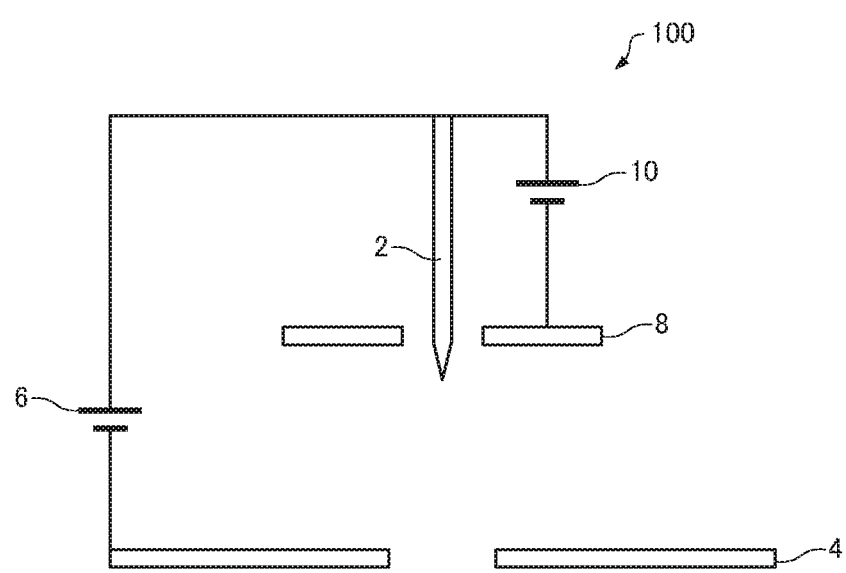
FIG. 6 is a diagram for explaining an operation of an electron gun when sharpening an emitter.

FIG. 5 is a flowchart illustrating an example of a sharpening method for an emitter according to one embodiment of the invention. FIG. 6 is a diagram for explaining an operation of the electron gun 100 when sharpening the emitter 2.

First, flashing is performed (S200). Specifically, the emitter 2 is instantaneously heated to a high temperature. Accordingly, adsorption gas and fine protrusions due to ion sputtering which are present on the surface of the emitter 2 can be removed. As a result of the flashing, the diameter of the emitter 2 increases.

Next, a negative voltage is applied to the extraction electrode 4 and a negative voltage is applied to the biased electrode 8 to form a strong electric field on the surface (the tip) of the emitter 2 (S202). At this point, since a negative voltage is applied to the extraction electrode 4, electrons are not emitted from the emitter 2. In this embodiment, since a strong electric field is formed on the surface of the emitter 2 using the biased electrode 8 in addition to the extraction electrode 4, the strong electric field can be readily formed on the surface of the emitter 2 as compared to a case where the strong electric field is formed only with the extraction electrode 4.

Next, the emitter 2 is heated in a state where a strong electric field is formed on the surface of the emitter 2 by the extraction electrode 4 and the biased electrode 8 (S204). Accordingly, the emitter 2 can be sharpened. For example, a protrusion (for example, a monatomic protrusion or a protrusion constituted by several atoms) can be formed on the tip of the emitter 2.

Next, a polarity of the extraction electrode 4 is changed (S206). In other words, a positive voltage (an extracting voltage) is applied to the extraction electrode 4. Accordingly, the electron gun 100 can be changed to a state (refer to FIG. 2) where electrons can be emitted from the emitter 2.

Due to the steps described above, the emitter 2 can be sharpened.

The sharpening method for an emitter in this embodiment has, for example, the following features.

In the sharpening method for an emitter, the tip of the emitter 2 is heated in a state where an electric field is formed on the tip of the emitter 2 by the extraction electrode 4 and the biased electrode 8. In the electron gun 100, since the voltage applied to the biased electrode 8 is variable, the tip (the surface) of the emitter 2 can be heated in a state where a strong electric field is formed on the surface (the tip) of the emitter 2 by the extraction electrode 4 and the biased electrode 8 (buildup). Therefore, the emitter 2 (a tungsten tip) can be readily sharpened.

For example, when the biased electrode 8 is fixed to the same potential as the emitter 2 and a position of the biased electrode 8 is optimized to a state where the emitter 2 is sharpened (refer to FIG. 3), an appropriate electric field cannot be formed on the surface of the emitter 2 when sharpening the emitter 2.

This is because, when forming a strong electric field on the surface of the emitter 2, the diameter of the emitter 2 has been increased due to flashing. With the biased electrode 8 optimized to a state where the emitter 2 has been sharpened, it is difficult to apply a strong electric field to the emitter 2 of which the diameter has been increased by flashing.

In contrast, in this embodiment, since the voltage applied to the biased electrode 8 is variable, an appropriate electric field can be formed on the tip of the emitter 2 in both a state where the emitter 2 has been sharpened and a state where the diameter of the emitter 2 has increased (in other words, regardless of the diameter of the emitter 2).

In the sharpening method for an emitter, a negative voltage is applied to the extraction electrode 4 and a negative voltage is applied to the biased electrode 8. Therefore, a strong electric field can be formed on the surface of the emitter 2 while preventing electrons from being emitted from the emitter 2.

In the sharpening method for an emitter, the emitter 2 is a tungsten tip. Therefore, the emitter 2 can be sharpened using the buildup described earlier.

4. Electron Microscope

Figure 7:
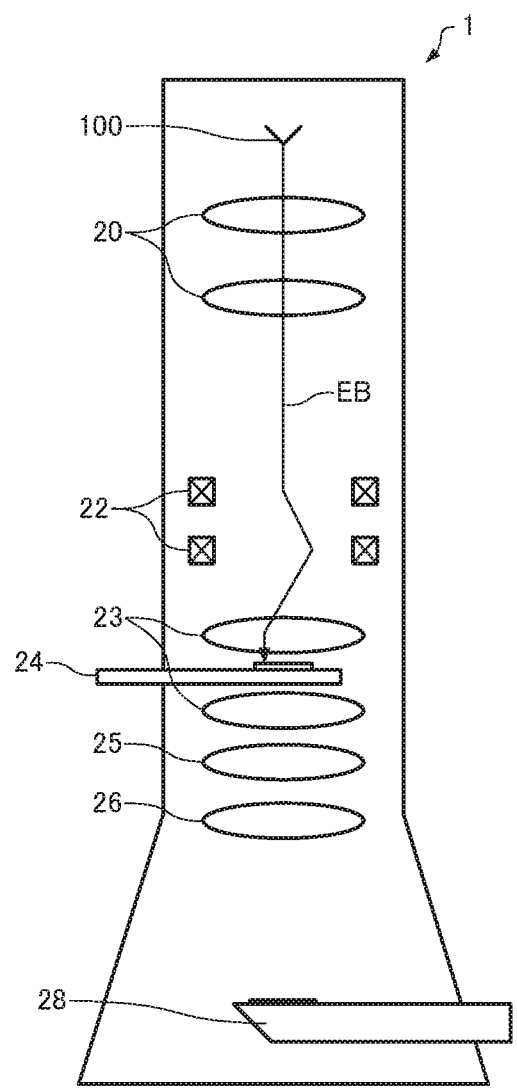
FIG. 7 is a diagram illustrating a configuration of an electron microscope according to one embodiment of the invention.

Next, an electron microscope according to one embodiment of the invention will be described with reference to the drawings. FIG. 7 is a diagram illustrating a configuration of an electron microscope 1 according to one embodiment of the invention.

The electron microscope 1 includes an electron gun according to the invention. Hereinafter, a case where the electron microscope 1 includes the electron gun 100 as an electron gun according to the invention will be described.

As illustrated in FIG. 7, the electron microscope 1 includes the electron gun 100, an illumination lens system 20, a scanning deflector 22, an objective lens 23, a specimen stage 24, an intermediate lens 25, a projector lens 26, and a detector 28.

The electron gun 100 emits an electron beam EB.

The illumination lens system 20 causes the electron beam EB emitted by the electron gun 100 to converge. The scanning deflector 22 causes the electron beam EB emitted from the electron gun 100 to be deflected. A specimen can be scanned by the converged electron beam EB by supplying the scanning deflector 22 with a scanning signal supplied from a controller (not shown). Accordingly, the electron microscope 1 can be caused to function as a scanning transmission electron microscope (STEM).

The objective lens 23 causes the electron beam EB to converge on the specimen to form an electron probe. In addition, the objective lens 23 forms an image with electrons having passed through the specimen.

The specimen stage 24 holds the specimen. In addition, the specimen stage 24 is capable of moving the specimen in horizontal and vertical directions and tilting the specimen.

The intermediate lens 25 and the projector lens 26 project (form) an image formed by the objective lens 23 to the detector 28.

The detector 28 detects electrons having passed through the specimen. The detector 28 detects electrons (transmission electrons) having passed through the specimen. A STEM image (a bright-field image) can be generated from an output signal of the detector 28. In addition, the detector 28 may be an annular detector which detects electrons scattered at a predetermined angle by the specimen. In other words, for example, the detector 28 may be a detector for obtaining a high-angle annular dark-field image (HAADF-STEM image) or a low-angle annular dark-field image (LAADF-STEM image).

Although not shown, the electron microscope 1 may be mounted with an aberration corrector such as a Cs corrector or an analyzer such as an energy-dispersive X-ray spectrometer (EDS) or an electron energy-loss spectrometer (EELS).

It should be noted that, while a case where the electron microscope 1 is a scanning transmission electron microscope (STEM) has been described above, the electron microscope 1 is not limited to a scanning transmission electron microscope (STEM) and may be an electron microscope such as a transmission electron microscope (TEM) or a scanning electron microscope (SEM).

According to the electron microscope 1, since the electron microscope 1 includes the electron gun 100, a decline in brightness of the electron beam EB and an increase in an energy spread of the electron beam EB can be reduced.

It should be noted that the embodiments and the modifications described above are merely examples and the invention is not limited thereto. For example, the respective embodiments and the respective modifications may be combined as appropriate.

The invention includes configurations that are substantially the same as the configurations described in the embodiments (for example, a configuration having the same function, method and result or a configuration having the same objective and effect). The invention also includes configurations in which non-essential elements described in the embodiments have been replaced by other elements. The invention further includes configurations having the same effects as those of the configurations described in the embodiments, or configurations capable of achieving the same objectives as those of the configurations described in the embodiments. Moreover, the invention includes configurations in which known art is added to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A cold cathode field-emission electron gun comprising:
an emitter;
an extraction electrode which extracts electrons from the emitter; and
a biased electrode which is disposed closer to the emitter than the extraction electrode,
wherein a voltage applied to the biased electrode is variable according to a change in a diameter of the emitter.

2. The cold cathode field-emission electron gun according to claim 1,
wherein the biased electrode and the extraction electrode form an electric field for causing electrons to be emitted from a tip of the emitter, and an electric field for accelerating the electrons emitted from the emitter between the emitter and the extraction electrode.

3. The cold cathode field-emission electron gun according to claim 1,
wherein, when causing the emitter to emit electrons, a negative voltage is applied to the biased electrode, and a positive voltage is applied to the extraction electrode.

4. The cold cathode field-emission electron gun according to claim 1,
wherein, when sharpening the emitter, a negative voltage is applied to the biased electrode, and a negative voltage is applied to the extraction electrode.

5. The cold cathode field-emission electron gun according to claim 4, wherein the emitter is a tungsten tip.

6. An electron microscope comprising the cold cathode field-emission electron gun according to claim 1.

7. An method for adjusting a cold cathode field-emission electron gun, which includes an emitter, with a desired emission current for the emitter for operation, an extraction electrode which extracts electrons from the emitter with a desired extracting voltage during operation, and a biased electrode which is disposed closer to the emitter than the extraction electrode, the method comprising:
causing electrons to be emitted from the emitter by causing the biased electrode and the extraction electrode to form an electric field by application of the desired extraction voltage, for causing electrons to be emitted from a tip of the emitter and an electric field for accelerating the electrons emitted from the emitter between the emitter and the extraction electrode,
wherein first and second negative bias voltages are applied to the biased electrode and, between application of the first and second negative bias voltages to the biased electrode, a voltage applied to the extraction electrode during operation is set to a positive voltage; and
wherein an absolute value of the second negative bias voltage is larger than an absolute value of the first negative bias voltage.

8. The method for adjusting a cold cathode field-emission electron gun according to claim 7,
wherein causing electrons to be emitted from the emitter further comprises:
setting a first voltage to be applied to the extraction electrode so that a desired emission current is obtained;
applying the first negative bias voltage to the biased electrode to reduce an emission current; and
setting the voltage to be applied to the extraction electrode to the positive value so that the desired emission current is obtained in a state where the first negative bias voltage is applied to the biased electrode and the emission current is reduced.

9. The method for adjusting a cold cathode field-emission electron gun according to claim 8, the method further comprising:
applying the second negative bias voltage to the biased electrode to reduce the emission current after setting the second voltage; and
setting a third voltage to be applied to the extraction electrode so that the desired emission current is obtained in a state where the second negative bias voltage is applied to the biased electrode and the emission current is reduced.

10. A sharpening method for an emitter in a cold cathode field-emission electron gun which includes an emitter, an extraction electrode which extracts electrons from the emitter, and a biased electrode which is disposed closer to the emitter than the extraction electrode, the sharpening method comprising:
heating a tip of the emitter in a state where an electric field is formed on the tip of the emitter by the extraction electrode and the biased electrode,
wherein a negative voltage is applied to the biased electrode and a negative voltage is applied to the extraction electrode, whereupon electrons are not emitted from the emitter, and
the voltage applied to the extraction electrode is changed from the negative voltage to a positive voltage following the heating of the tip of the emitter, whereupon electrons are emitted from the emitter.

11. The sharpening method for an emitter according to claim 10, wherein the emitter is a tungsten tip.

* * * * *